United States Patent [19]

Morino

[11] 4,140,265

[45] Feb. 20, 1979

[54] METHOD AND APPARATUS FOR POSITIONING THE END OF A CONDUCTIVE FILAMENT AT A PREDETERMINED AND REPEATABLE GEOMETRIC LOCATION FOR COUPLING TO A PREDETERMINED TERMINAL AREA OF AN ELEMENT

[75] Inventor: Ronald Morino, Sea Cliff, N.Y.

[73] Assignee: Kollmorgen Technologies Corporation, Dallas, Tex.

[21] Appl. No.: 667,541

[22] Filed: Mar. 16, 1976

Related U.S. Application Data

[63] Continuation-in-part of Ser. No. 590,572, Jun. 26, 1975, abandoned.

[51] Int. Cl.² .......................................... H01L 21/603
[52] U.S. Cl. ............................. 228/180 A; 228/4.5; 219/85 F
[58] Field of Search ........... 228/4.5, 6 A, 179, 180 A; 219/85 D, 85 F

[56] References Cited

U.S. PATENT DOCUMENTS

| | | | |
|---|---|---|---|
| 3,313,464 | 4/1967 | Avedissian | 228/4.5 X |
| 3,328,875 | 7/1967 | Pennings | 228/4.5 X |
| 3,643,321 | 2/1972 | Field et al. | 228/4.5 X |
| 3,648,354 | 3/1972 | Mashino et al. | 228/4.5 X |
| 3,689,983 | 9/1972 | Eltzroth et al. | 228/179 |
| 3,706,409 | 12/1972 | Lederer | 228/6 A |
| 3,724,068 | 4/1973 | Galli | 228/6 A X |
| 3,734,386 | 5/1973 | Hazel | 228/4.5 |
| 3,941,298 | 3/1976 | Nicklaus | 228/180 A |

Primary Examiner—Al Lawrence Smith
Assistant Examiner—K. J. Ramsey

[57] ABSTRACT

Coupling of the end portion of a continuous conductive filament to an element mountable at a work station is attained in accordance with the method and apparatus of the instant invention by emplacing the conductive filament from a feed means so that the end portion of the conductive filament is congruent with a predetermined geometric location, and arranging the feed means relative to the work station so that the geometric locus defined by the position of the emplaced conductive filament is predetermined and repeatable. Advantageously, the continuous conductive filament may be emplaced by pushing or pulling. The end portion is thereafter joined to a predetermined terminal area on an element which is coextensive with the predetermined geometric location. Preferably, the conductive filament is subsequently joined to a second terminal area then cut or broken to form a permanent or temporary package. Moreover, in the preferred embodiment of the invention a plurality of continuous conductive filaments are initially joined in a gang to predetermined areas of the element and subsequently to predetermined terminal areas of a carrier member to form a permanent or temporary package.

31 Claims, 15 Drawing Figures

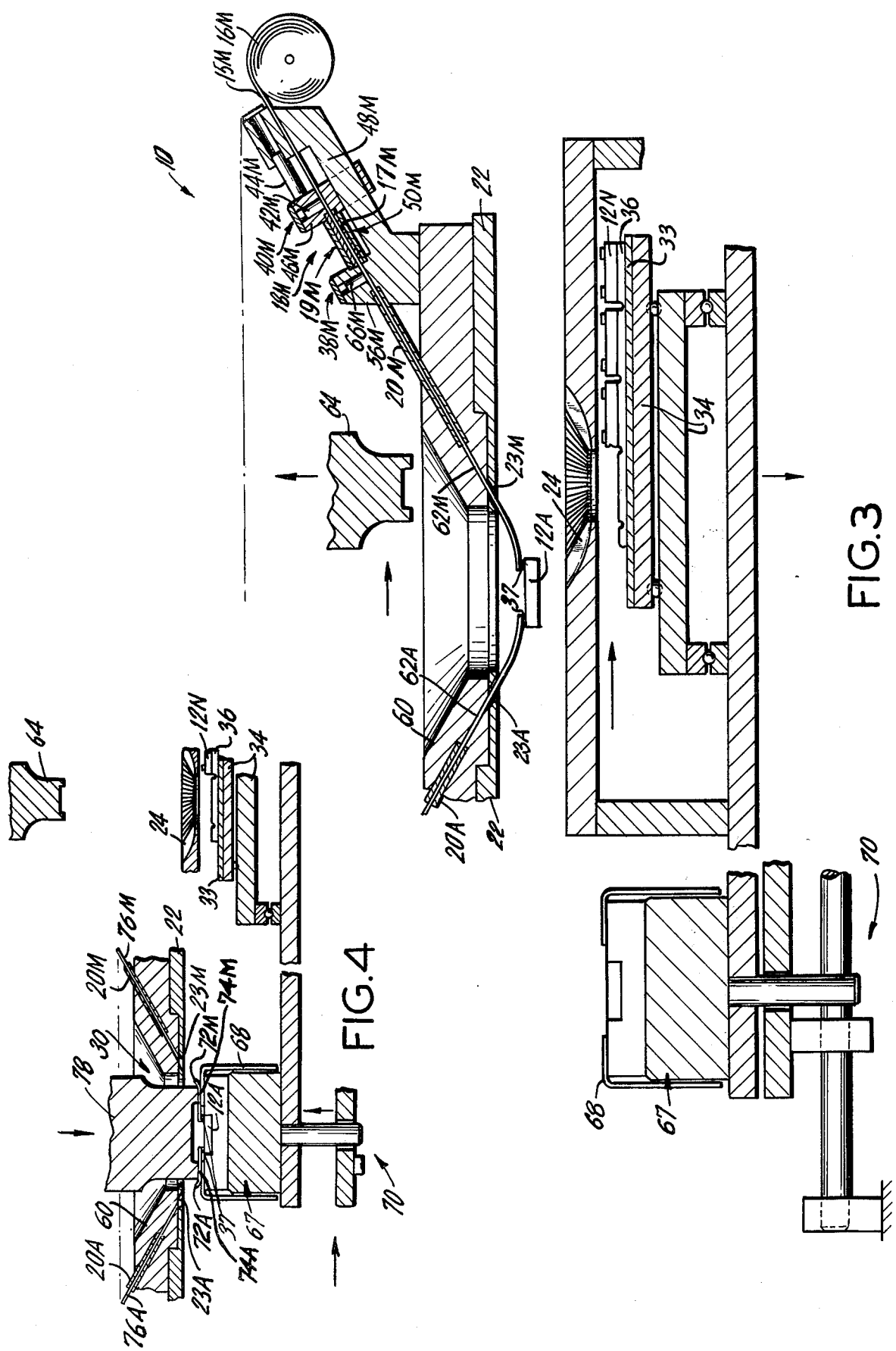

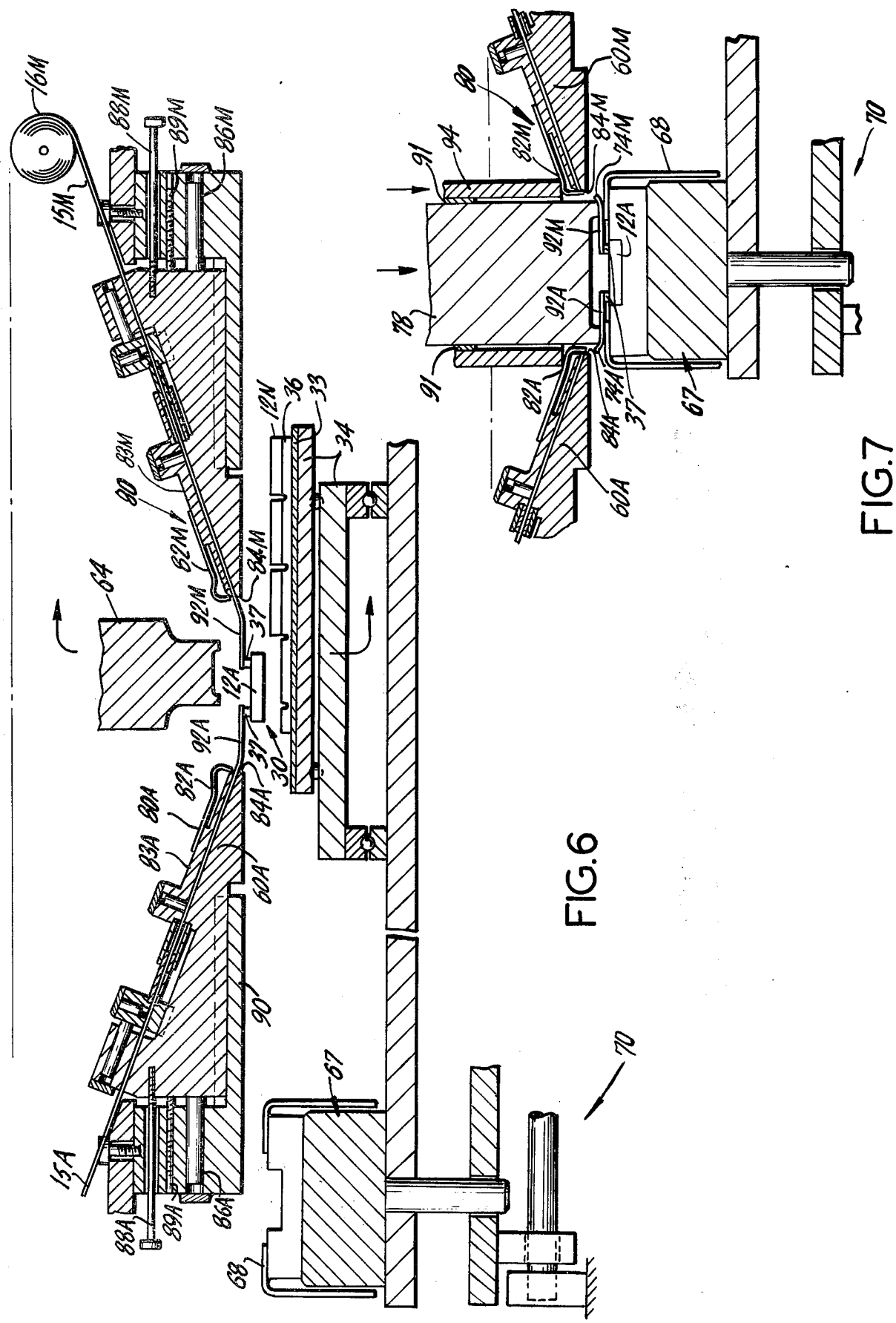

METHOD AND APPARATUS FOR POSITIONING THE END OF A CONDUCTIVE FILAMENT AT A PREDETERMINED AND REPEATABLE GEOMETRIC LOCATION FOR COUPLING TO A PREDETERMINED TERMINAL AREA OF AN ELEMENT

This application is a continuation-in-part of applicant's pending application Ser. No. 590,572, filed June 26, 1975, now abandoned.

The present invention relates to terminal connector systems, and more specifically to a method and apparatus for coupling a continuous conductive filament to a predetermined terminal area of an element. The term "terminal area" as used herein includes defined areas of integrated circuits, terminating harnesses, hybrid circuits, printed circuits, optical circuits, and fluidic circuits. In the preferred embodiments, a plurality of continuous conductive filaments are joined to predetermined terminal areas (pads) of an element and subsequently joined to predetermined terminal areas of a carrier member.

With the aid of advanced technology, the cost of processing integrated circuits has fallen. However, in contrast, the assembly of integrated circuits has remained substantially a manual operation so that with escalating wages the cost of assembly has steadily risen.

Generally, wire bonding has been the most commonly used technique for connecting leads to integrated circuit chips. The general approach to wire bonding has been a manual approach to effect a sequence of bonds one at a time. Generally, in carrying out the manual wire bonding approach, an operator, with the aid of a microscope and manipulator, manually positions a wire and wire bonding tool to bond a wire to a pad on an integrated circuit chip and then to a finger of a lead frame. The wire is then broken. This sequence is repeated for each pad on the integrated circuit chip. This manual approach to wire bonding adds appreciably to the cost of assembling integrated circuit packages. Additionally, uncontrolled breaking of the bonded wires often results in fracturing of the bonds causing early failure during use.

Attempts to automate the wire bonding operation with programmed tool movement and bonding sequences has resulted in some improvement over the aforementioned manual approach. However, a sequential mode of operation as well as the need to precisely position the integrated circuit chip relative to certain reference points has prevented any broad acceptance of automatic wire bonders.

Various other techniques have challenged the aforementioned wire bonding techniques. However, these other techniques are costly and not readily adaptable to the large number of integrated circuit chip geometries encountered.

A relatively recent approach to coupling leads to integrated circuit chips involves the use of an automated film-carrier. With the film-carrier assembly approach, the film carries a copper lead frame. The inner ends of the leads are gang bonded to pads on an integrated circuit chip by an inner lead bonder. After blanking or punching these leads are extended outwardly in cantilever fashion and are gang bonded to a package, i.e., a dual-in-line, or a flexible or rigid circuit board. Sprocket holes along along the sides of the film are used to enable the drive mechanism for the inner lead bonder to advance the film after the integrated circuit chip has been bonded to the film-carrier and also to register the lead frame over an integrated circuit chip.

In addition to adding significantly to the cost of the assembled package, with the film-carrier assembly approach, the film-carrier must be carefully handled since the film is subject to dimensional instability and the leads are easily deflected out of position during handling.

Details of the aforementioned film-carrier assembly technique as well as other approaches to connecting leads to integrated circuit chips is found in the article entitled "Film-Carrier Technique Automates The Packaging Of IC Chips", by Stephen E. Grossman, Electronics, May 16, 1974 issue, pp. 89–95.

It is an object of the present invention to provide an improved method and apparatus for joining a continuous conductive filament to a predetermined terminal area of an element which overcomes the disadvantages of the aforementioned prior art techniques.

It is another object of the present invention to provide a method and apparatus for reliably positioning the end of a continuous conductive filament at a predetermined and repeatable geometric location to enable automatic assembly of a conductive filament to an element.

It is a still further object of the present invention to provide a method and apparatus for reliably joining the conductive filament to a second terminal area to enable the automated assembly of elements to form a permanent or temporary package.

It is a still further object of the present invention to provide a method and apparatus for fully automating the assembly of integrated circuit chip packages.

It is a still further object of the present invention to provide a method and apparatus for connecting leads to integrated circuit chips at greatly reduced cost.

Other objects, aspects, and advantages of the present invention will be apparent from the specification and the accompanying drawings.

Briefly, coupling of the end portion of a continuous conductive filament to an element mountable at a work station is attained in accordance with the method and apparatus of the instant invention by emplacing the conductive filament from a feed means so that the end portion of the conductive filament is congruent with a predetermined geometric location, and arranging the feed means relative to the work station so that the geometric locus defined by the position of the emplaced conductive filament is predetermined and repeatable. Advantageously, the continuous conductive filament may be emplaced by pushing or pulling. The end portion is thereafter joined to a predetermined terminal area on an element which is coextensive with the predetermined geometric location. Preferably, the conductive filament is subsequently joined to a second terminal area then cut or broken to form a permanent or temporary package. Moreover, in the preferred embodiment of the invention a plurality of continuous conductive filaments are initially joined in a gang to predetermined terminal areas of the element and subsequently to predetermined terminal areas of a carrier member to form a permanent or temporary package.

The preferred embodiments of the present invention are illustrated in the accompanying drawings. However, it should be expressly understood that the method and apparatus of the present invention should not be construed to be limited solely to the preferred embodiments. The drawings are as follows:

FIG. 3 is a partial sectional view similar to FIG. 2 showing the suspended integrated circuit chip after the continuous conductive filaments are joined thereto;

FIG. 4 is a partial cross-sectional view, with parts broken away, showing a carrier bonding head and a carrier feed means for bonding the integrated circuit chip to a carrier member;

FIGS. 5-7 are sectional views similar to FIGS. 2-4, showing another embodiment according to the present invention in which the apparatus moves inwardly and outwardly relative to the work station to deliver continuous conductive filaments to registered integrated circuit chips for joining the filaments thereto and to facilitate subsequent joining to a carrier member;

Figure 8:
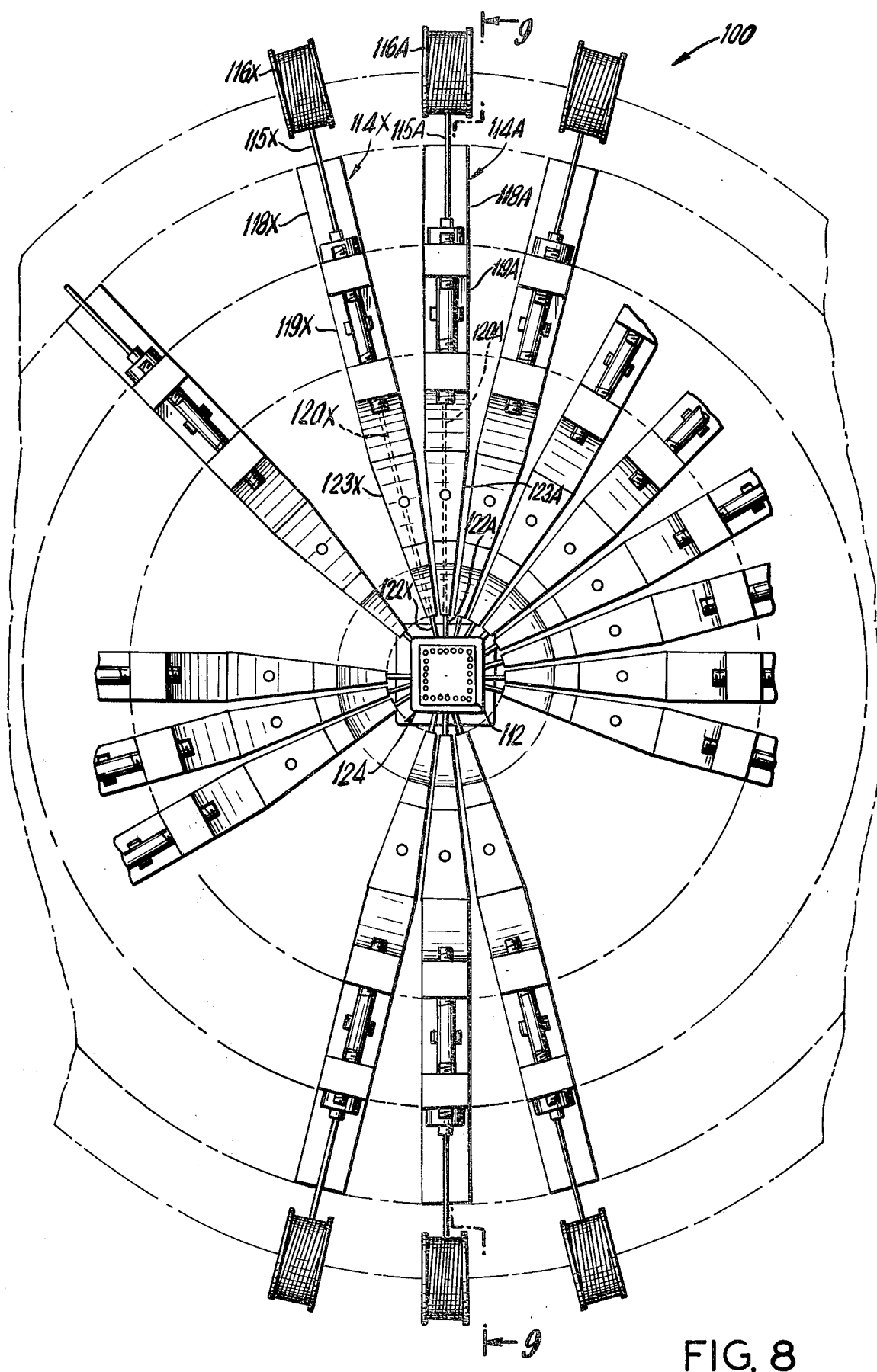
FIG. 8 is a top plan view of another apparatus in accordance with the present invention for joining a plurality of continuous conductive filaments to predetermined terminal areas (pads) of an element (integrated circuit chip)
Figure 9:
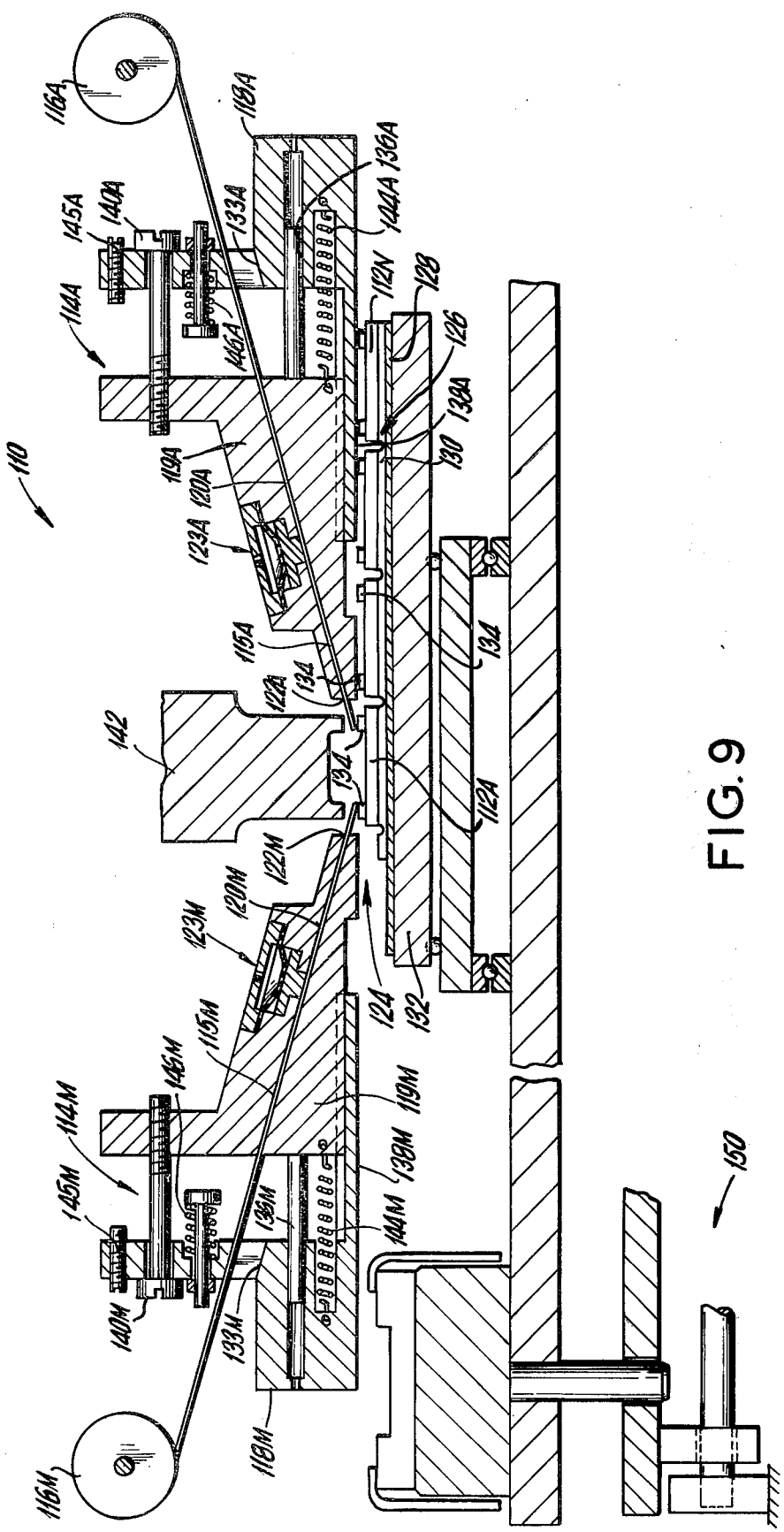
Figure 10:
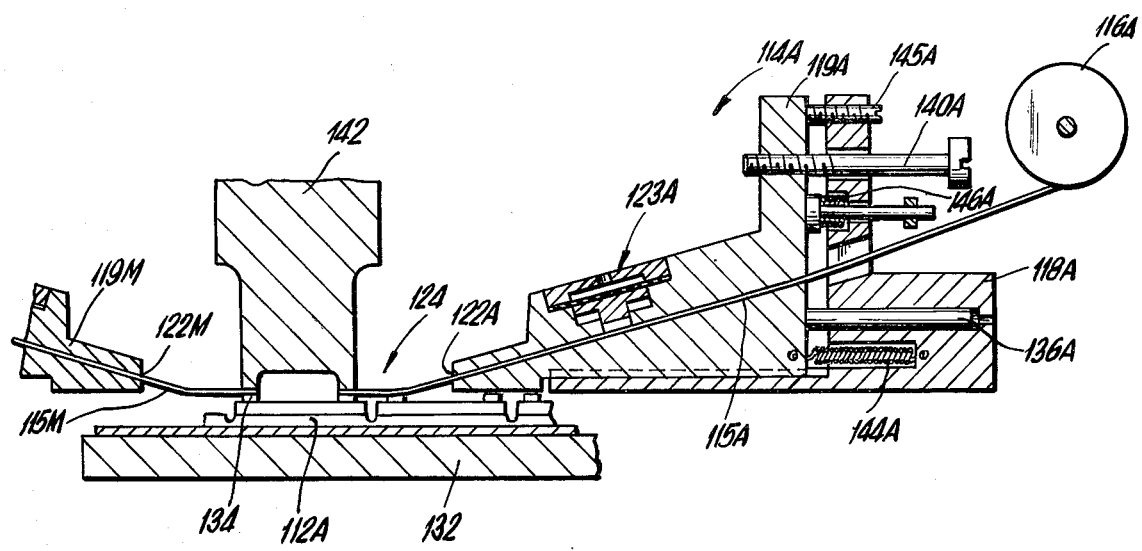
Figure 11:
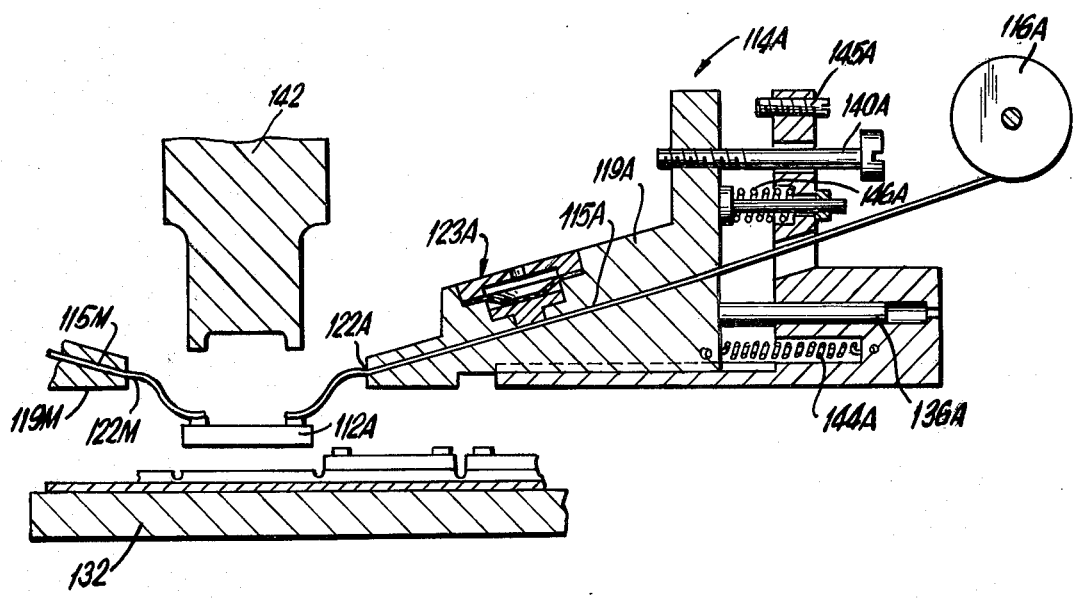
Figure 12:
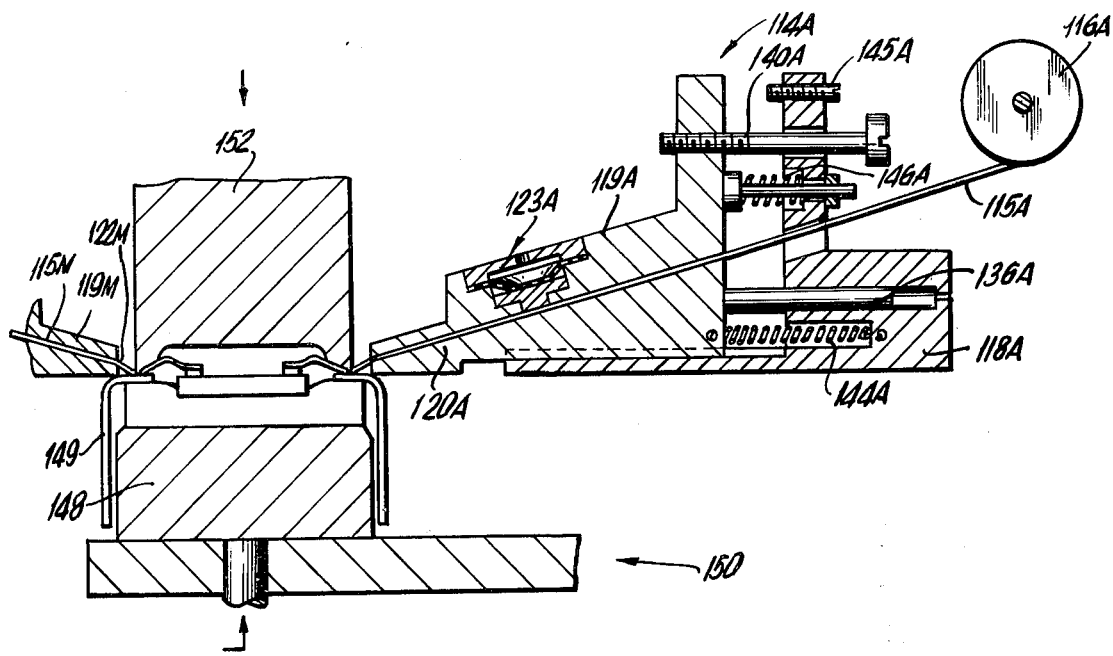
Figure 13:
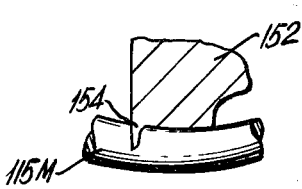
Figure 14:
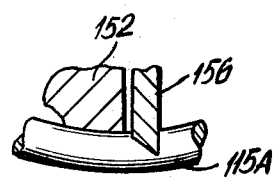
Figure 15:
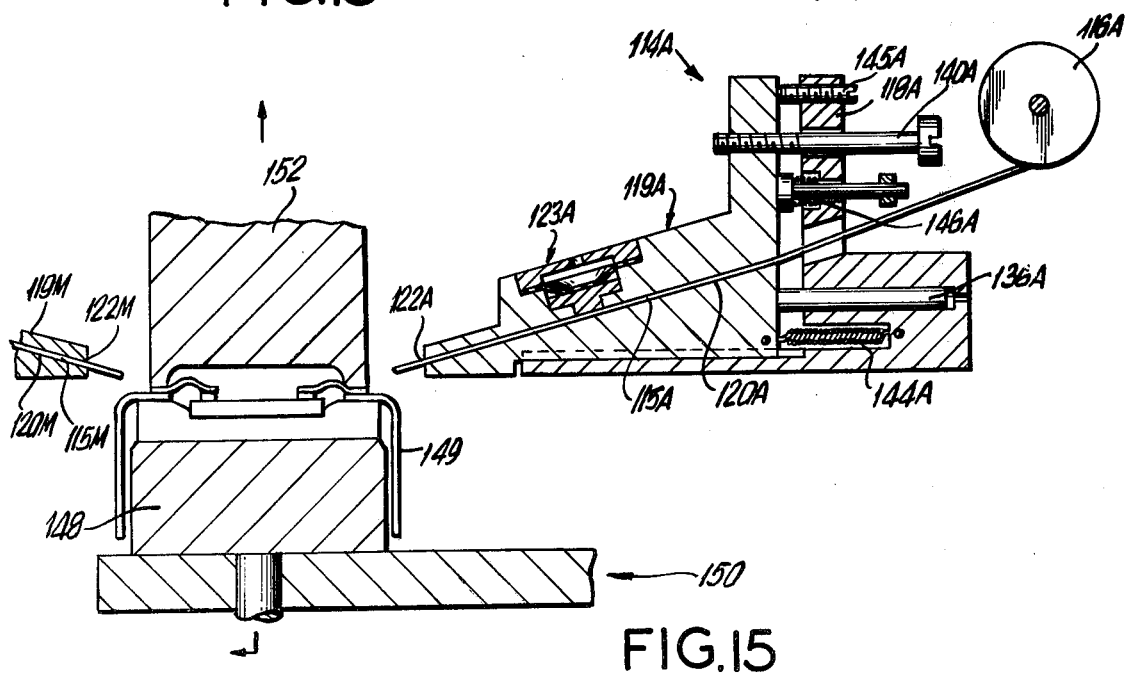

FIG. 9 a cross-sectional view taken along line 9—9 of FIG. 8 showing a pair of filament guide members in their forwarded position;

FIG. 10 is a partial sectional view similar to FIG. 9, with parts broken away, showing the ends of a pair of continuous conductive filaments being joined to an integrated circuit chip with the filament guide members in their retracted position;

FIG. 11 is a partial sectional view similar to FIG. 9, with parts broken away, showing the filament guide members in their intermediate position;

FIG. 12 is a partial sectional view similar to FIG. 9, with parts broken away, showing the filament guide members in their intermediate position with the carrier bonding head in contact with the joined filaments;

FIG. 13 is an enlarged view of one embodiment of the carrier bonding head for introducing a notch into the joined filaments;

FIG. 14 is an enlarged view of another embodiment for introducing a notch into the joined filaments; and FIG. 15 is a partial sectional view similar to FIG. 9, with parts broken away, showing the joined filaments portions separated from the remainder of the continuous conductive filaments and the filament guide members in their retracted position.

Figure 1:
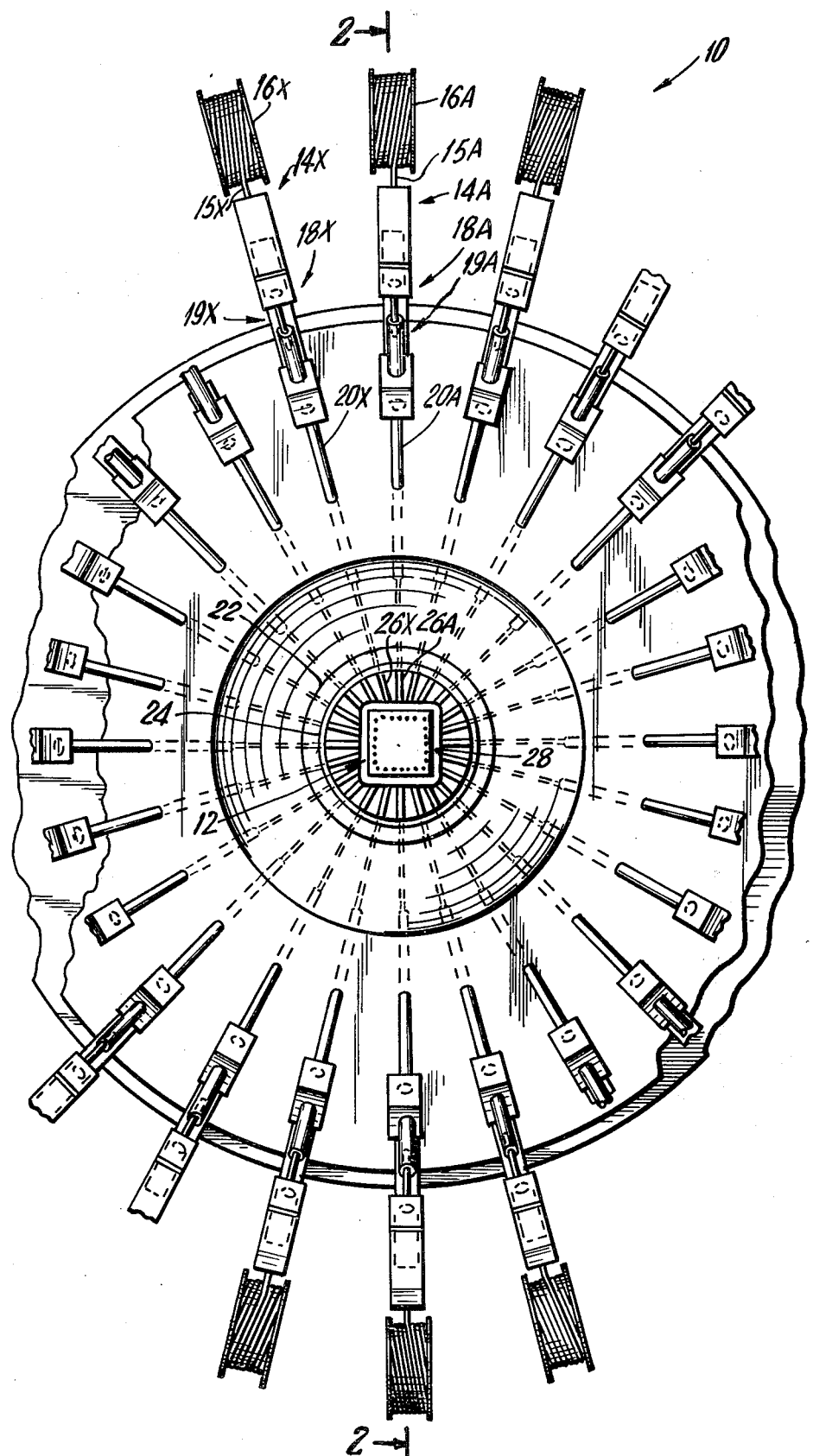
FIG. 1 is a top plan view of an apparatus for joining a plurality of continuous conductive filaments to predetermined terminal areas (pads) of an element (integrated circuit chip) in accordance with the instant invention.

Referring to FIG. 1, an apparatus in accordance with the present invention for joining continuous conductive filaments to terminal areas of integrated circuit chips is illustrated generally at 10. Although the apparatus 10 is illustrated with wire and integrated circuit chips, it should be understood that it is not so limited, but may be employed to join conductive filaments to any of the aforementioned terminal areas. As previously mentioned the term "terminal areas" as used herein should be construed to include fixed areas of integrated circuits, terminating harnesses, hybrid circuits, printed circuits, optical circuits, and fluidic circuits. The term "join" or "joining" as used herein includes any technique for providing the desired electrical, optical, or fluidic connection. Examples of joining techniques are thermocompression bonding, ultrasonic bonding, adhesive bonding, soldering, welding, mechanical fastening, and the like.

The apparatus 10 includes a plurality of filament feed channels 14A-X corresponding in number to the number of continuous conductive filaments, here wires 15A-X, to be joined to an element, here an integrated circuit chip 12. As shown in FIG. 1, the apparatus 10 includes 24 filament feed channels 14A-X. Generally, the number of filament feed channels 14 will vary, as desired; 14 to 40 filament feed channels 14 are commonly used for providing 14 to 40 connections to an integrated circuit chip 12. Each filament feed channel 14A-X includes a supply means, here spools 16A-X of fine metal wire 15A-X, hitch feed drives 18A-X for clamping and pushing the fine metal wire 15A-X, telescoping tubes 19A-X, conveying tubes 20A-X, and a filament cutter 22 having apertures 23A-X, see FIG. 2. A recessed filament guide plate 24 is positioned below the filament cutter 22. The recessed filament guide plate 24 has a plurality of machined grooves 26A-X for receiving the fine wires 15A-X exiting from the conveying tubes 20A-X and the filament cutter 22.

The machined grooves 26A-X extend along the upper surface of the recessed filament guide plate 24 to a central aperture or window 28 of the recessed filament guide plate 24. The shape of the aperture or window 28 of the recessed filament guide plate 24 is generally chosen to conform with the geometry of the integrated circuit chip 12 to which the wires 15A-X are to be joined. As shown in FIG. 1, the window 28 is generally rectangular or square in shape for use with similarly shaped integrated circuit chips 12. However, it should be understood that integrated circuit chips having different geometries may be used with the apparatus 10 by simply changing the recessed wire guide plate 24 with a recessed wire guide plate conforming to the configuration of the integrated circuit chips to be used. Advantageously, the width of the machined grooves 26A-X is slightly greater than the diameter of the fine wire 15A-X, e.g., about 0.0003" greater, to ensure that the fine wires 15A-X exiting from the wire cutter 22 pass easily into the machined grooves 26A-X and therethrough to the integrated circuit chip 12.

Figure 2:
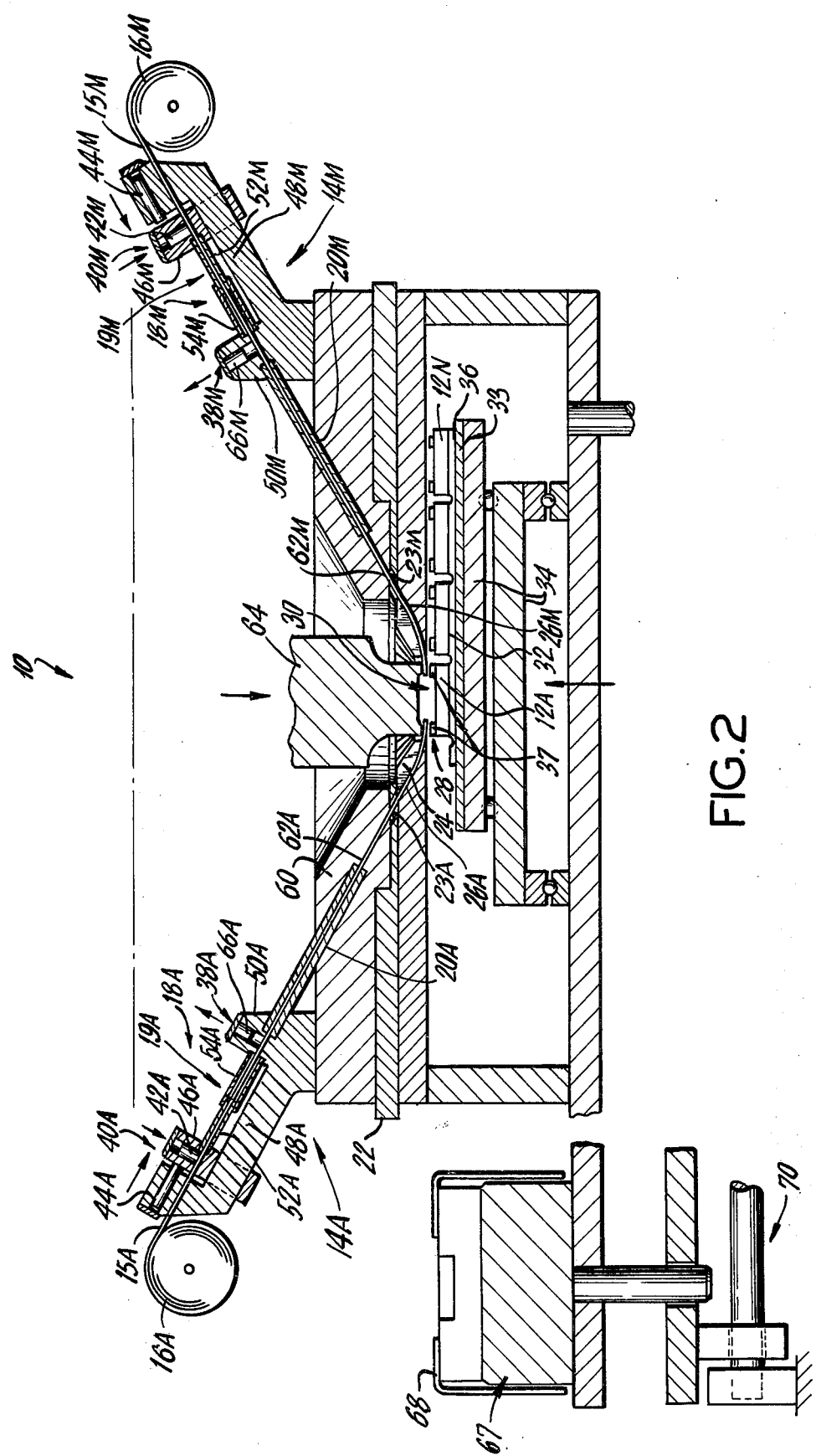
FIG. 2 is a cross-sectional view taken along line 2—2 of FIG. 1 and showing additional components of the apparatus.

Referring to FIG. 2, apparatus 10 is positioned with the window 28 overlying a work station 30. Integrated circuit chips 12A-N are sucessively registered at the work station 30 prior to joining the end portions of the wires to the integrated circuit chips. It should be understood that the sequence of operation is the same and is occurring simultaneously in each filament feed channel 14A-X. Therefore, for the sake of clarity, only the operation of the two filament feed channels 14A and 14M illustrated in FIGS. 2-4 will be described.

Advantageously, the integrated circuit chips 12A-N may be formed as a wafer 32. The wafer 32 is securely mounted to a carrier plate 33 with an adhesive 36, e.g., wax, having a low melting point. The wafer is then precisely cut into individual chips, e.g., with a diamond saw, and the carrier plate 33 is positioned on and registered with a suitably controlled X-Y table 34 for registering the integrated circuit chips 12A-N at the work station 30. See, e.g., U.S. Pat. No. 3,706,409 (Lederer) for a discussion of one technique for mounting and cutting a wafer, and positioning the cut chips or pellets at a work station for bonding leads thereto.

It should be understood that it is also within the scope of the instant invention to orient individual chips manually or with the assistance of manipulators and a microscope, or automatically with the use of optical recognition and positioning devices. With these latter approaches the wafer can be scribed and individual chips broken therefrom without the need to mount the wafer to an adhesive layer and then cut it into individual chis as described in the aforesaid Lederer patent.

The fine metal wire 15A-X may be bare metal or it may be insulated with heat strippable polyurethane. The metal may be copper, gold plated copper, tinned copper, gold, or aluminum of any desired cross-sectional configuration with a thickness or diameter in the range of about 0.7 mil to about 4 mils, normally 2 mils.

The machined grooves 26A and 26M of the recessed filament guide plate 24 have their entrant ends enlarged or funnel-shaped to aid in capturing the ends of the wires exiting from the wire cutter 22. The machined grooves 26A and 26M then guide the ends of the fine wire to the window 28 and precisely locate or register the wire end portions over the work station 30 closely spaced over or in contact with the terminal areas in the form of pads 37 on the integrated circuit chip 12A registered at the work station 30. Each integrated circuit chip 12A-N has a number of pads 37 corresponding to the number of fine wires 15 to be joined thereto. The pads 37 are advantageously gold topped or topped with solder to facilitate joining of the wire end portions thereto, as will be described below.

The X-Y table 34, the hitch feed drives 18A and 18M, the telescoping tubes 19A and 19M, the conveying tubes 20A and 20M, and the recessed filament guide plate 24 coact to ensure that the end portions of the fine wires are registered over the pads 37.

Each of the hitch feed drives 18A and 18M includes a stationary clamping member 38A and 38M and a movable clamping member 40A and 40M, respectively, which coact to clamp and pull the fine wire from the spools 16A and 16M, respectively. The length of the wire feed is advantageously adjustable in small increments in accordance with activation of the hitch feed drives 18A and 18M to feed fixed lengths of wire 15A and 15M to the pads 37.

The fine wire is fed by pneumatically activating the movable clamping members 40A and 40M so that pistons 42A and 42M clamp tightly the wires 15A and 15M. Pistons 44A and 44M are then pneumatically activated to slide housings 46A and 46M along guides 48A and 48M. The clamped wires 15A and 15M are pushed through telescoping tubes 19A and 19M which are interconnected between slidable housings 46A and 46M and stationary piston housings 50A and 50M, respectively. The telescoping tubes 19A and 19M include smaller diameter tubes 52A and 52M, joined at one end to the slidable housings 46A and 46M, respectively, and larger diameter tubes 54A and 54M joined at one end to the stationary piston housings 50A and 50M. When the movable clamping members 40A and 40M slide forward on the guides 48A and 48M, the smaller diameter tubes 52A and 52M telescope within the larger diameter tubes 54A and 54M, respectively.

Arranged on the side of housings 50A and 50M opposite to the telescoping tubes 19A and 19M are conveying tubes 20A and 20M. The conveying tubes 20A and 20M have one end joined to stationary housings 50A and 50M and their other ends mounted within a rotatable support plate 60. The rotatable support plate 60 also includes channels 62A and 62M for receiving the wire exiting from the conveying tubes 20A and 20M. Positioned below the rotatable support plate 60 is the stationary filament cutter 22. The filament cutter 22 includes enlarged apertures 23A and 23M to receive the fine wires 15A and 15M. Positioned below the wire cutter 22 and aligned with apertures 23A and 23M are machined grooves 26A and 26M of recessed filament guide plate 24.

Thus, the fine and flexible wires 15A and 15M are fully supported and guided along a closely confined fixed path from the points of engagement by the movable clamping members 40A and 40M to the window 28. Thereafter, the fine wire 15A and 15M is unsupported over an extension of the fixed path for a short distance and extends over the work station 30 with the end portions registered in a stationary position over predetermined fixed areas of the work station 30. It has generally been found that the maximum length of the total fixed path from the point of engagement of the wires 15A and 15M with the movable clamping members 40A and 40M to the end portions of the wires 15A and 15M registered over the predetermined fixed areas of the work station 30 is approximately three orders of magnitude greater than the wire diameter, i.e., 1000 times greater. Therefore, approximately 2 inches for 2 mil wire. The end portions of the wires 15A and 15M exiting from the recessed filament guide plate 24 are unsupported for a relatively short distance of approximately 10 mils to 30 mils and assume a stationary position over the work station 30 for subsequent joining to predetermined areas or pads 37 of an integrated circuit chip 12A mounted at the work station 30.

When the wire end portions are registered over the pads 37 at the work station 30, a chip bonding head 64, e.g., which may advantageously be continuously or pulse heated, is reciprocated downwardly for simultaneous contact with all the wire end portions registered over the pads 37. The heated chip bonding head 64 effects a thermocompression bond of the wire end portions. If the integrated circuit chips 12 are conveyed to the work station 30 in wafer form, the heat generated by the bonding head 64 also melts the wax 36 and frees the individual integrated circuit chip 12A from the carrier plate 33.

After the wire end portions are bonded to the pads 37, the stationary clamping members 38A and 38M are pneumatically activated and pistons 66A and 66M grip the wires 15A and 15M. Pistons 42A and 42M, and 44A and 44M are then deactivated and the housings 46A and 46M, along with attached smaller diameter tubes 52A and 52M, return to the position shown in FIG. 2 under influence of return springs (not shown) coupled to slidable housings 46A and 46M.

The chip bonding head 64 is then reciprocated upwardly and to the right, and the X-Y table 34 and recessed filament guide plate 24 are reciprocated downwardly and to the right, see FIG. 3. Thus, when the X-Y table 34 and recessed filament guide plate 24 are moved away from the integrated circuit chip 12A, the integrated circuit chip 12A is effectively held suspended by the bonded wire portions, see FIG. 3. As shown in FIGS. 2 and 3, a carried feed member 67, which carries a permanent or temporary carrier member or lead frame 68, is mechanically coupled to the X-Y table 34 and moved therewith via a shuttle 70. The shuttle 70 moves the carrier member 68 into registration with the bonded integrated circuit chip 12A at the work station 30. (Alternatively, the bonded integrated circuit chip 12A may be conveyed to a second work station, above the carrier feed member 67, as desired.). The shuttle 70 may be driven by a suitable servomotor to alternately position the X-Y table 34 (integrated circuit chips) and the carrier feed member 66 (carrier members) at the work station 30.

As shown in FIG. 4, the carrier feed member 67 moves to the right and upwardly to engage and support the suspended integrated circuit chip 12A at the work station 30. While the pistons 66A and 66M are still gripping the wires 15A and 15M, a carrier bonding head 78 is reciprocated downwardly into contact with predetermined portions of the fine wires 15A and 15M to bond the predetermined wire portions to the carrier member 68. Heat may be generated in the carrier bonding head 78 by an electric current or if the carrier member 68 is a temporary thermoplastic carrier, ultrasonic heating may be advantageously employed.

The integrated circuit chips 12A-N may be advantageously joined to permanent frames, such as a DIP (Dual-In-Line-Package) lead frames, or to temporary carrier frames. Advantageously, heavier wires may be used for joining the integrated circuit chips to inexpensive sprocketed film having apertures for accommodating the integrated circuit chips and leads extending outwardly therefrom. Subsequently the outer ends of the wires may be directly joined to terminal areas on hybrid circuits or printed circuits, as desired.

While the carrier bonding head 78 is in contact with the fine wires 15A and 15M, as shown in FIG. 4, the rotatable support plate 60 is rotated, e.g., 3° to 4°, relative to the stationary filament cutter 22 to shear or cut the bonded wire portions 74A and 74M from the remaining fine wire portions 76A and 76M. The wire portions 74A and 74M includes short stubs 72A and 72M which protrude slightly upward from their their point of jointure with the carrier member 68. It should be understood that in some applications it may be desirable to cut the wires prior to bonding them to the carrier member 68.

Figure 5:
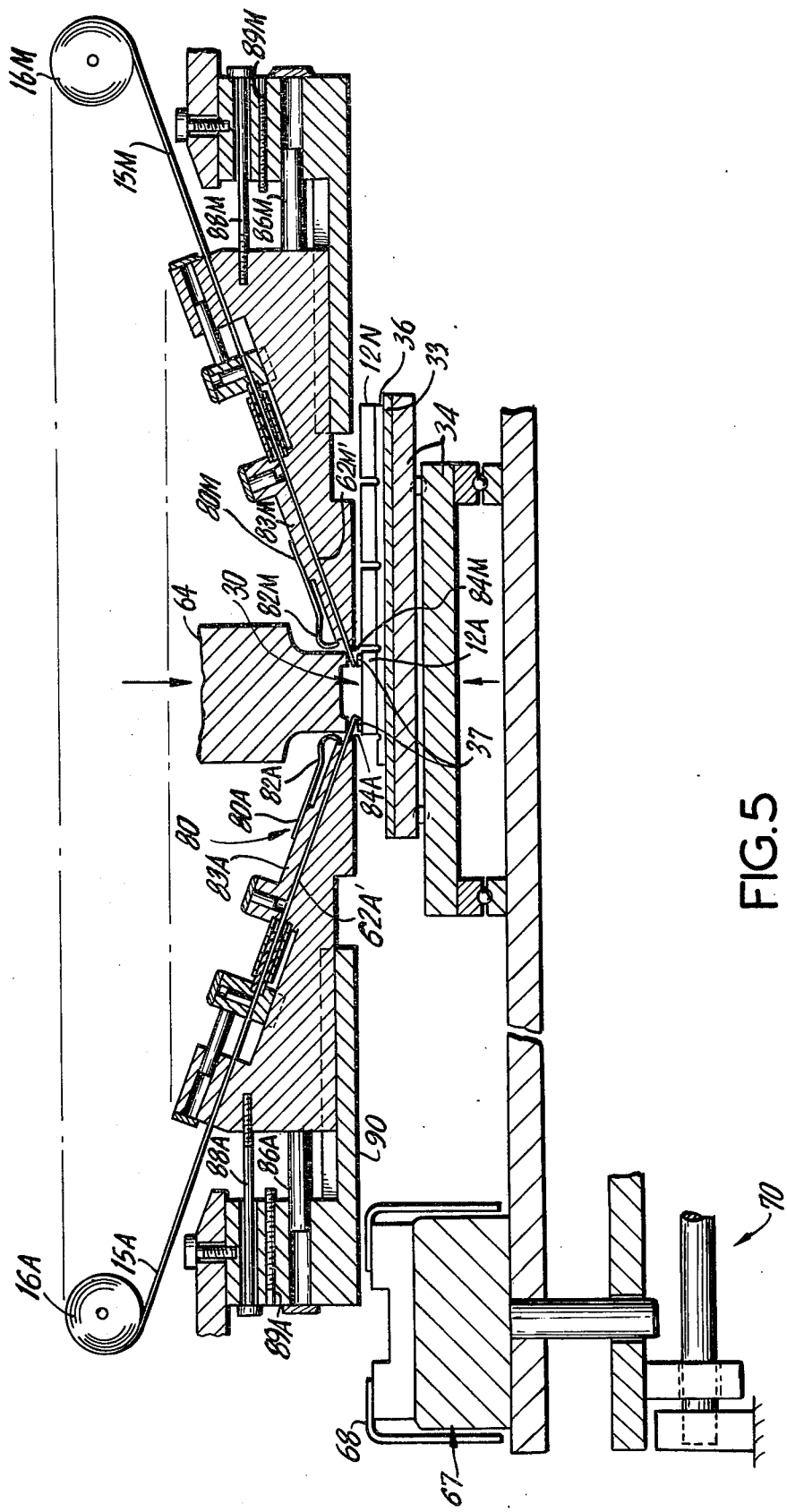

Referring to FIGS. 5-7, elements similar to those appearing in FIGS. 1-4 are similarly numbered. However, in this embodiment the support plate 60 is fragmented into a number of support elements 83A-X corresponding with the number of wires 15A-X, and the filament guide plate 24 is eliminated. Moreover, support elements 83A and 83M include elongate channels 62A' and 62M' and the conveying tubes 20A and 20M are eliminated. Additionally, filament cutter 22, which was positioned below rotatable support plate 60 in FIGS. 1-4, is replaced with cutter members 80A and 80M mounted on the upper surface of support elements 83A and 83M and having cutter elements 82A and 82M positioned above corresponding exit orifices 84A and 84M of channels 62A' and 62M'.

Referring specifically to FIG. 5, preferably after an integrated circuit chip 12A is positioned at the work station 30, support elements 83A and 83M are driven inwardly by pneumatically activated pistons 86A and 86M to position exit orifices 84A and 84M in closely spaced relationship with the work station 30 and at a fixed distance from pads 37. A fixed length of the wires 15A and 15M is then pushed or projected from the exit orifices 84A and 84M and moves along an unsupported fixed path so that the wire end portions register over the pads 37. Subsequently, chip bonding head 64 is operated as described with reference to FIGS. 2 and 3. Return springs (not shown) couple the support elements 83A and 83M to a stationary frame 90 to return the support elements 83A and 83M to the position shown in FIG. 6 after bonding is completed and the pistons 86A and 86M are deactivated. The inward movement of support elements 83A and 83M is controlled by stops 88A and 88M, see FIG. 5, and the outward movement of the support elements 60A and 60M is controlled by stops 89A and 89M, see FIG. 6.

Referring to FIG. 6, subsequent to the gang bonding operation of FIG. 5, the bonding head 64 is moved upwardly and to the right (see arrow), and the X-Y table 34 is moved downwardly and to the right (see arrow), and the pistons 86A and 86M are deactivated to return the support elements 83A and 83M to the position shown in FIG. 6, thereby exposing predetermined lengths of wires 92A and 92M. The gang bonded integrated circuit chip 12A remains suspended as described with reference to FIG. 3. Then the shuttle 70 positions the carrier feed member 67 at the work station 30 for supporting the integrated circuit chip 12A and registering the carrier member 68 with the wires 92A and 92M, see FIG. 7. The predetermined lengths of wires 92A and 92M are then bonded to the carrier member 68 by carrier bonding head 78. Positioned adjacent to the outer surface of the bonding head 78 and in contact therewith via bearings 91 is a reciprocatable member 94 which is moved downwardly to engage cutter members 80A and 80M and depress cutter elements 82A and 80M for cutting the wire portions 92A and 92M while the frame bonding head 78 is in contact therewith.

Generally, the sequence of operation of the embodiments of the present invention in accordance with FIGS. 1-7 is as follows:

An integrated circuit chip 12A is registered at the work station 30. Remotely positioned fine wire is pulled from spools 16A-X by energizing the hitch feed drives 18A-X and the wire end portions travel along predetermined fixed paths for registration over the work station 30, specifically over pads 37 of the registered integrated circuit chip 12A. The wire end portions are then joined in a gang to the pads 37 by the chip bonding head 64, which is then moved away from the work station 30. While the wax 36 under the integrated circuit chip 12 is in the molten state, the X-Y table 34 and the portions of the predetermined fixed paths (filament guide plates 24 or support elements 83) adjacent the work station 30 are removed therefrom, so that the bonded integrated circuit chip 12A is suspended at the work station 30. The carrier feed member 67 carrying a carrier member 68 is then moved into position at the work station 30 to support the integrated circuit chip 12 and register the carrier frame 68 with predetermined portions of the lengths of fine wires bonded to the integrated circuit chip 12A. The carrier bonding head 78 is then moved into contact with the predetermined portions for bonding the predetermined portions in a gang to the carrier member 68. While the carrier bonding head 78 is engaging the fine wire portions, a filament cutter 22 or 80 is activated to simultaneously shear or cut predetermined lengths of the bonded wires. The bonded integrated circuit chip 12A and carrier member 68, the carrier bonding head 78, and carrier feed member 67 are then removed from the work station 30 and the X-Y table 34 is reactivated for registering another integrated circuit chip at the work station 30. The abovementioned sequence of operation is then repeated continuously to produce completed integrated circuit packages.

Thus, gang bonding of the end portions of fine wires to pads 37 on an integrated circuit chip 12A (inner bond) and subsequently gang bonding of other predetermined portions of the bonded fine wires to a carrier member 68 (outer bond) is rapidly and reliably achieved with an expected capability of providing in excess of 1000 completed integrated circuit packages per hour.

Referring to FIG. 8, an apparatus in accordance with the present invention for joining continuous conductive filaments to terminal areas of integrated circuit chips is illustrated generally at 100.

Although the apparatus 100 is shown in use with wire 115A-X and an integrated circuit chip 112, it should be understood that it is not so limited, but may be employed to join continuous conductive filaments to any of the aforementioned terminal areas. The apparatus 100 includes a plurality of filament or wire guide members 114A-X corresponding in number to the number of continuous conductive filaments, here wires 115A-X, to be joined to an element, here an integrated circuit chip 112. As shown in FIG. 8, the apparatus 100 includes 24 filament guide members 114A-X. Generally, the number of filament guide members 14 will vary, as desired. As previously mentioned, usually 14 to 40 filament guide members will be used for providing 14 to 40 connections to an integrated circuit chip 112. Each filament guide member 114A-X includes a supply means, here spools 116A-X of fine metal wire 115A-X, stationary elements 118A-X, translatable guide portions 119A-X, filament guide channels 120A-X, having exit apertures 122A-X, and clamping means 123A-X for engaging portions of the filaments in the filament guide channels 120A-X remote from their end portions and pulling fixed lengths of the filaments from the spools 116A-X. The filament guide members 114A-X are circumferentially spaced about a work station 124.

As shown in FIG. 8, the integrated circuit chip 112 is generally rectangular or square in shape. However, it should be understood that integrated circuit chips having different geometries may be used with the apparatus 100 simply eliminating the use of some of the filament guide members 114A-X, adding additional filament guide members and/or rearranging the spacing therebetween, as appropriate. Advantageously, the width of the filament guide channels 120A-X is slightly greater than the diameter of the fine wires 115A-X, e.g., about 0.0003" greater, to closely confine the movement of the wires 115A-X therein and ensure that the fine wires 115A-X exiting from the spools 116A-X pass easily therethrough.

Referring to FIG. 9, apparatus 100 is shown positioned at the work station 124. Integrated circuit chips 112A-N are successively registered at the work station 124 prior to joining the end portions of the wires 115A-X to the integrated circuit chips 112A-N. It should be understood that the sequence of operation is the same and is occurring simultaneously in each filament guide member 114A-X. Therefore, for the sake of clarity, only the operation of the two filament guide members 114A and 114M will be described.

Advantageously, the integrated circuit chips 112A-N may be formed as a wafer 126. The wafer 126 securely mounted to a carrier plate 128 with an adhesive 130, e.g., wax, having a low melting point. The wafer is then precisely cut into individual chips, e.g., with a diamond saw, and the carrier plate 128 is positioned on and registered with a suitably controlled X-Y table 132 for registering the integrated circuit chips 112A-N at the work station 124. For example, see U.S. Pat. No. 3,706,409 (Lederer), previously referred to, for a discussion of one technique for mounting and cutting a wafer, and positioning the cut chips or pellets at a work station for bonding leads thereto.

It should be understood that, as previously mentioned, with reference to FIGS. 1-7, it is also within the scope of the instant invention to orient individual chips manually, or with the assistance of manipulators and a microscope, or automatically with the use of optical recognition and positioning devices. With these latter approaches the wafer can be scribed and individual chips broken therefrom without the need to mount the wafer to an adhesive layer and then cut into individual chips as described in the aforementioned Lederer patent.

The fine metal wires 115A-X may be bare metal or they may be insulated with heat strippable polyurethane. The metal may be copper, gold plated copper, tinned copper, gold, or aluminum of any desired cross-sectional configuration with a thickness or diameter in the range of about 0.7 mil to about 4 mils, normally about 2 mils.

Advantageously, filament guide channels 120A and 120M of the translatable guide portions 119A and 119M have their entrant ends enlarged or funnel-shaped to aid in capturing the ends of the wires 115A and 115M exiting from receiving apertures 133A and 133M in stationary members 118A and 118M. The filament guide channels 120A and 120M then guide the end portions of the fine wires 115A and 115M toward the exit apertures 122A and 122M. Initially, for each new spool of wire, the wires 115A and 115M may be manually threaded through the filament guide channels 120A and 120M so that the end portions of the wires 115A and 115M extend a predetermined fixed distance from the exit apertures 122A and 122M a position adjacent the work station 124. Thereafter, the operation is automatic until the spools of wire are exhausted.

Each integrated circuit chip 112A-N has a number of pads 134 corresponding to the number of fine wires 115 to be joined thereto. The pads 134 are advantageously gold topped or topped with solder to facilitate joining of the wire end portions thereto, as will be described below. The X-Y table 132, the translatable guide portions 119A and 119M, and clamping means 123A and 123M coact to ensure that the end portions of the fine wires 115A and 115M are registered over the pads 134, assuming a stationary and unsupported position over the pads 134.

Initially, the translatable guide portions 119A and 119M are in a retracted position relative to the work station 124, with the end portions of the wires 115A and 115M extending outwardly a predetermined fixed distance from the exit apertures 122A and 122M, see FIG. 15. The clamping means 123A and 123M are positioned remote from the end portions of the wires 115A and 115M for engaging a portion of the wires 115A and 115M extending through filament guide channels 120A and 120M. Preferably, the clamping means 123A and 123M are positioned approximately midway along the length of the filament guide channels 120A and 120M and advantageously include diaphragm clamps. The clamping means 123A and 123M are pneumatically activated from a remote source (not shown) to fixedly clamp and unclamp the wires 115A and 115M, as desired.

The clamped fine wires 115A and 115M are translated or moved into a forward position at the work station 24, see FIG. 9, by pneumatically activating horizontally arranged pistons 136A and 136M. A pressure of 70 psig is adequate. The pneumatically activated pistons 136A and 136M push or move translatable guide portions 119A and 119M radially inwardly toward the work station 124 with the translatable guide portions 119A and 119M sliding along the bases 138A and 138M of stationary members 118A and 118M. Movement of the translatable guide portions 119A and 119M pulls a fixed length of clamped wires 115A and 115M from spools 116A and 116M. This fixed length is proportional to the distance through which the translatable guide portions 119A and 119M are moved. A limit on the forward movement of the translatable guide portions 119A and 119M is provided by adjustable forward stops 140A and 140M coupled between the translatable guide portions 119A and 119M and the stationary members 118A and 118M. In the most forward position, the wire ends 115A and 115M assume a stationary and unsupported position at the work station 124 and over the pads 134, see FIG. 9.

Thus, the fine and flexible wires 115A and 115M are fully supported and guided along a closely confined fixed path from the points of engagement by the clamping means 123A and 123M to the exit apertures 122A and 122M. Thereafter, the fine wires 115A and 115M are unsupported for a short distance, e.g., 10 to 30 mils, with the end portions being registered in a stationary and unsupported position over the work station 124. It has generally been found that the maximum length of the total fixed path from the point at which the wires 115A and 115M are clamped to the end portions of the wires 115A and 115M is approximately three orders of magnitude greater than the wire diameter, i.e., 1000 times greater. Therefore, approximately 2 inches for 2 mil wires.

When the wire end portions are registered over the pads 134 at the work station 124, a chip bonding head 142, e.g., which may be advantageously continuously or pulse heated, is reciprocated downwardly for simultaneous contact with all the wire end portions registered over the pads 134. The heated bonding head 142 provides thermocompression bonding of all the wire end portions to the pads 134. If the integrated circuit chips 112A-N are conveyed to the work station 124 in wafer form, the heat generated by the bonding head 142 also melts the wax 130 and frees the individual integrated circuit chip 112A from the carrier plate 128.

After the wire end portions are bonded to the pads 134, the horizontal pistons 136A and 136M and clamping means 123A and 123M are deactivated enabling the translatable guide portions 119A and 119M to be returned to their retracted position, see FIG. 10, under the influence of return springs 144A and 144M coupled between the translatable guide portions 119A and 119M and stationary members 118A and 118M. Rearward stops 145A and 145M limit the rearward movement or retraction of the translatable guide portions 119A and 119M.

The chip bonding head 142 is then reciprocated upwardly and to the right, and the X-Y table 132 is reciprocated downwardly and to the right, see FIG. 11. Thus, when the X-Y table 132 is moved away from the integrated circuit chip 112A, the integrated circuit chip 112A is effectively held suspended by the bonded wires, see FIG. 11. The clamping means 123A and 123M are then pressurized to clamp the wires 115A and 115M and the translatable guide portions 119A and 119M are moved to an intermediate position (between the retracted and forward positions) by applying low pressure, e.g., 30 psig, to the horizontal pistons 136A and 136M. The force of the horizontal pistons 136A and 136M combine with a spring force resulting from bias springs 146A and 146M to overcome the spring force exerted on the translatable guide portions 119A and 119M by return springs 144A and 144M to move the translatable guide portions 119A and 119M to a predetermined intermediate position. In this intermediate position the force of horizontal pistons 136A and 136M and the force of the bias springs 146A and 146M which urge the translatable guide portions 119A and 119M toward the work station 124 are in equilibrium with the force of the return springs 144A and 144M which urges the translatable guide portions 119A and 119M to a fully retracted position. The movement from the retracted position to the intermediate position with the clamping means 123A and 123M pressurized introduces slack into the bonded wires 115A and 115M adjacent their end portions, see FIG. 11. The presence of this slack in the wires 115A and 115M tends to compensate for thermoexpansion, neutralizing or eliminating potentially detrimental effects on the bonded wire portions resulting from differentials in thermoexpansion of the integrated circuit chip 112A and its temporary or permanent carrier member.

Referring to FIG. 12, after slack is introduced into the wires 115A and 115M, and while the translatable guide portions 119A and 119M are still in the intermediate position, carrier feed member 148, carrying a permanent or temporary carrier member or lead frame 149, mechanically coupled to the X-Y table 132 is moved into contact with the integrated circuit chip 112A to provide support thereto via a shuttle 150. (Alternatively, the bonded integrated circuit chip 112A and filament guide members 114A and 114M may be conveyed to a second work station, above the carrier feed member 148, as desired). The shuttle 150 may be driven by a suitable servomotor to alternately position the X-Y table 132 (integrated circuit chips) and the carrier feed member 148 (carrier members) at the work station 124.

As seen by the arrows in FIG. 12, the carrier feed member 148 moves to the right and upwardly to engage and support the suspended integrated circuit chip 112A at the work station 124. A carrier bonding head 152 is then reciprocated downwardly into contact with predetermined portions of the fine wires 115A and 115M to bond these predetermined wire portions to the carrier member 149. Heat may be generated in the carrier bonding head 152 by an electric current or if the carrier member 149 is a temporary thermoplastic carrier, ultrasonic heating may be advantageously employed.

For example, the integrated circuit chips 112A-N may be advantageously joined to permanent frames, such as DIP (Dual-In-Line-Package) lead frames, or to temporary carrier frames. Advantageously, heavier wires may be used for joining the integrated circuit chips to inexpensive sprocketed films having apertures for accommodating the integrated circuit chips and leads extending outwardly therefrom. Subsequently, the outer ends of the leads may be directly joined to terminal areas on hybrid circuits or printed circuits, as desired.

Advantageously, as the carrier bonding head 152 engages and bonds the fine wires 115A and 115M, see FIG. 12, notch or indentation is made in the fine wires 115A and 115M, adjacent the outer bond to provide a predictable break for subsequently separating the bonded wire portions from the remainder of the continuous wires 115A and 115M, see FIGS. 13 and 14.

As shown in FIG. 13 the carrier bonding head 152 may include an integrally formed cutter portion 154. Alternately, a separate cutting element 156 may be arranged circumjacent the carrier bonding head 152, see FIG. 14. The cutting elements 154 or 156 are reciprocated into contact with the wires 115A and 115M forming notches therein.

Referring to FIG. 15, while the clamping means 123A and 123M are pressurized and the carrier bonding head 152 is in contact with the bonded wires 115A and 115M, the horizontal pistons 136A and 136M are deactivated. The deactivation of the horizontal pistons 136A and 136M causes retraction of the translatable wire guides 119A and 119M under influence of the return springs 144A and 144M, thereby applying a force to the wires 115A and 115M clamped between the carrier bonding head 152 and the clamping means 123A and 123M. Thus, the wires 115A and 115M break predictably at the notches, see FIG. 15, with the result that a fixed length of wire extends outwardly from exit apertures 122A and 122M for joining to the next integrated circuit chip 112B. The carrier bonding head 152 and carrier feed member 148 are then reciprocated away from the work station 124 and the shuttle 150 registers the next integrated circuit chip 112B at the work station 124.

Although in the embodiment shown in FIGS. 8-15, notches are introduced into the joined wires and the joined wire portions are separated by breaking, it should be understood that the wires may be cut if desired as illustrated in the embodiments shown in FIGS. 1-7.

Generally, the preferred sequence of operation of the embodiment of the present invention in accordance with FIGS. 8-15 is as follows:

An integrated circuit chip 112A is registered at the work station 124. To commence operation, with the translatable guide portions 119A-X in the retracted position, the wires 115A-X are manually threaded through the filament guide members 114A-X with the end portions of the wires 115A-X extending outwardly from the exit apertures 122A-X a predetermined distance, as previously described. The remotely positioned fine wires 115A-X are then clamped by pressurizing clamping means 123A-X and the horizontal pistons 136A-X are pressurized to move the translatable guide portions 119A-X forward, thereby simultaneously pulling fixed lengths of wires 115A-X from the spools 116A-X for positioning the end portions of the wires 115A-X over the pads 134 of an integrated circuit chip 112A registered at the work station 124. The wire end portions are then contacted by the chip bonding head 142 and the wire end portions are simultaneously or gang bonded to the pads 134. The clamping means 123A-X and horizontal pistons 136A-X are depressurized and the translatable guide portions 119A-X are returned to their normal or retracted position. With the wax 130 under the integrated circuit chip 112 in the molten state, the X-Y table 132 and the chip bonding head 142 are retracted, so that the bonded integrated circuit chip 112A is suspended at the work station 124. The clamping means 123A-X is then pressurized and the horizontal pistons 136A-X partially pressurized to move the translatable guide portions 119A-X to an intermediate position introducing slack into the wires 115A-X. The carrier feed member 148 carrying a carrier member 149 is then moved into position at the work station 124 to support the integrated circuit chip 112A and register the carrier member 149 with predetermined portions of the fine wires bonded to the integrated circuit chip 112A. The carrier bonding head 152 is moved into contact with the predetermined portions for bonding these predetermined portions in a gang to the carrier member 149. Simultaneously or subsequently, as desired, a notch is introduced into the wires 115A-X adjacent the outer bonds while the carrier bonding head 152 is still engaging the wire. The horizontal pistons 136A-X are then depressurized to fully retract the translatable guide portions 119A-X, exerting forces on the bonded wires 115A-X thereby allowing the bonded wires 115A-X to undergo predictable breaks at the notches. The bonded integrated circuit chip 112A and the carrier member 149, the carrier bonding head 152, and carrier feed member 148 are then removed from the work station 124 and the X-Y table 132 registers another integrated circuit chip 112B at the work station 124.

The abovementioned sequence of operation is then repeated continuously to produce completed integrated circuit packages (inner and outer bonds). Advantageously, the cycle time to complete a package is expected to be between about 1.5 and 3 seconds which approximates the time required with the film carrier method to obtain only inner bonds. Moreover, if No. 43 AWG wire is used the width of the ends of the translatable guide portions 119A-X at the exit apertures 122A-X is only about 5.5 mils.

Thus, gang bonding of the end portions of the fine wires 115A-X to pads 134 on an integrated circuit chip 112A (inner bond) and subsequently gang bonding of predetermined portions of the bonded fine wires to a carrier member 149 (outer bond) is rapidly and reliably achieved and is expected to provide in excess of 1000 completed integrated circuit packages per hour.

In accordance with the preferred embodiments of the present invention, accurate positioning of the wire end portions over the pads 37 or 134 (terminal areas) of an integrated circuit chip 12A or 112A (element) is attained by:

1. Mounting a wafer 32 or 126 of integrated circuit chips 112A-N and its carrier plate 33 or 128 on an X-Y table 34 or 132, the relative position of each integrated circuit chip within the wafer 32 or 126 being intrinsically accurate so that each successive integrated circuit chip can be accurately positioned at a work station 30 or 124.
2. Utilizing filament feed channels 14A-X, with or without the filament guide plate 24, or translatable guide portions 119A-X to provide predetermined paths for accurately positioning the wires 15A-X or 115A-X adjacent the work station 30 or 124 and registering the end portions of the wires 15A-X or 115A-X with predetermined terminal areas at the work station 30 or 124.
3. Controlling the length of feed of the fine wires 15A-X or 115A-X in small increments to position fixed lengths of wire over predetermined terminal areas at the work station 30 or 124.

In summary, the present invention provides a method and associated apparatus for coupling the end portions of one or more continuous conductive filaments to one or more terminal areas on an element mountable at a work station by emplacing the conductive filaments from feed means so that their end portions are congruent with predetermined geometric locations and arranging the feed means relative to the work station so that the geometric loci defined by the positions of the emplaced conductive filaments are predetermined and repeatable.

It should be understood that various modifications may be made in the sequence employed in carrying out the present invention and in the specific apparatus illustrated therein. For example, the element (integrated circuit) may be registered at the work station subsequent to feeding the end portions of the wires to the work station as well as beforehand, as desired. Additionally, the joining or bonding steps may take place at the same work station or at different work stations. It should also be understood that various drive feed means may be employed for feeding the wire, including pneumatic diaphragm clamps and piston type wire clamps and the hitch feed drive means may be substituted by a programmable capstan-roller feed means. Moreover, the horizontal pistons may be replaced by solenoids, cams, lead screws, and the like. Various types of joining or bonding heads may also be used, e.g., those heated intermittently or continuously. Also, the integrated circuit chips may be maintained at ambient temperature or preheated to a suitable base temperature, as desired.

It should also be understood that the size and cross-sectional configuration of the fine wire, its composition, and any insulation thereon may vary and are dependent upon the specific application. Fine gold wire, e.g., 0.7 mils or 1 mil may be used. A bare copper wire, tinned or gold plated, if desired, having a diameter of 0.0022 inches (No. 43 AWG) is suitable for thermocompression bonding or similar joining applications. Copper wire, tinned if desired, and having heat strippable polyurethane insulation may be used to obtain eutectic solder reflow joints, particularly when long wire leads are desired for complex interconnection requirements. Aluminum leads may also be employed for ultrasonic bonding directly to an integrated circuit chip.

It should also be understood that the apparatus of the present invention may be used with a number of similar apparatus to transfer and connect integrated circuit chips from a wafer directly to the interconnection circuit in an assembly line type operation.

It should be further understood by those skilled in the art that various modifications may be made in the present invention without departing from the spirit and scope thereof, as described in the specification and defined in the appended claims.

What is claimed is:

1. In a method for coupling the end portion of each of a plurality of continuous conductive filaments to an element mountable at a work station, the improvement which comprises:

establishing a plurality of predetermined fixed paths between said end portions of the conductive filaments and the work station;

simultaneously pushing a fixed length of each of the conductive filaments including its end portion to move said filaments through said predetermined fixed paths and cause said end portions to assume stationary and unsupported positions over the work station;

subsequently joining said end portions positioned over the work station to predetermined terminal areas of the element mounted at the work station;

positioning said element with said end portions of said conductor filaments joined thereto in stationary position over a carrier having terminal areas for receiving said conductor filaments;

registering a predetermined portion of each of the conductor filaments with a terminal area of said carrier;

joining said predetermined portion of each of said conductor filaments with said registered terminal area of said carrier; and cutting the portions of the conductor filaments joining the terminal areas of said element with the terminal areas of said carrier from the remainder of the conductor filaments.

2. The method recited in claim 1, wherein:

the continuous conductive filaments are fine wires having a thickness between about 0.7 to about 4 mils.

3. The method recited in claim 1, including the step of:

closely confining the movement of the conductive filaments over a portion of said predetermined fixed paths.

4. The method recited in claim 3, wherein:

said predetermined fixed paths include unsupported portions over the work station.

5. The method recited in claim 1, wherein:

the maximum length of said predetermined fixed paths is approximately three orders of magnitude of the thickness of the conductive filaments.

6. The method recited in claim 1, including the step of:

registering the element with the work station prior to the pushing step.

7. The method recited in claim 1, wherein:

the joining step is attained by thermocompression bonding of said end portions of the conductive filaments to the predetermined terminal areas of the element.

8. The method recited in claim 1, wherein:

said end portions of the conductive filaments are joined in a gang to said first predetermined terminal areas of the element and subsequently said predetermined portions are joined to said predetermined terminal areas of said carrier in a gang.

9. The method recited in claim 1, wherein:

said end portions of the conductive filaments are joined in a gang to the predetermined terminal areas.

10. In an apparatus for coupling the end portion of each of a plurality of continuous conductive filaments to an element mountable at a work station, the improvement which comprises:

annular guide plate means for establishing a plurality of predetermined fixed paths beween the end portion of each of a plurality of the conductive filaments and the work station;

feed means for pushing fixed lengths of each of said plurality of said conductive filaments including the end portion thereof to move each said conductive filament along said annular guide plate and through said predetermined fixed paths and cause the end portions to assume stationary and unsupported positions over the work station; and joining means for subsequently joining the end portions positioned over the work station to predetermined terminal areas of the element mounted at the work station.

11. The apparatus recited in claim 10, wherein:

the continuous conductive filaments are fine wires having a thickeness between about 0.7 to about 4 mils.

12. The apparatus recited in claim 10, wherein:
said annular guide plate means closely confines the movement of the conductive filaments over a portion of said predetermined fixed paths.

13. The apparatus recited in claim 12, wherein:
said predetermined fixed paths include unsupported portions over the work station.

14. The apparatus recited in claim 10, wherein:
the maximum length of said predetermined fixed paths is approximately three orders of magnitude of the thickness of the conductive filaments.

15. The apparatus recited in claim 10, including positioning means for registering the element with the work station prior to activation of said feed means.

16. The apparatus recited in claim 10, wherein:
said joining means includes a thermocompression bonding head for joining the end portions of the conductive filaments to predetermined terminal areas of the element.

17. The apparatus recited in claim 10, including:
positioning means for effecting registration between predetermined portions of the conductive filaments and second predetermined terminal areas;
joining means for joining said predetermined portions to said second predetermined terminal areas; and
cutting means for cutting the portions of the conductive filaments joining said first and second predetermined terminal areas from the remainder of the conductive filaments.

18. The apparatus recited in claim 17, including:
shuttle means for effecting relative movement between said guide means and the work station prior to activation of said positioning means.

19. The apparatus recited in claim 17, wherein:
said first joining means joins the end portions of the conductive filaments in a gang to said first predetermined terminal areas and said second joining means subsequently joins said predetermined portions to said second predetermined terminal areas in a gang.

20. The apparatus recited in claim 17, including:
second positioning means for registering a carrier member including said second predetermined terminal areas with the element.

21. The apparatus recited in claim 10, in which said joining means includes means for joining the end portions of the conductive filaments in a gang to the predetermined terminal areas.

22. In an apparatus for coupling the end portion of each of a plurality of continuous conductive filament into a stationary and unsupported position over the work station; and
joining means for subsequently joining the end portion positioned over the work station to a predetermined terminal area of the element mounted at the work station.

23. The apparatus recited in claim 22, wherein:
said translatable guide means closely confines the movement of the continuous conductive filament.

24. The apparatus recited in claim 23, wherein:
said translatable guide means includes an exit aperture from which the end portion of the continuous conductive filament extends.

25. The apparatus recited in claim 22, wherein:
the maximum length of the fixed path is approximately three orders of magnitude of the thickness of the continuous conductive filament.

26. The apparatus recited in claim 22, including means for registering the element with the work station subsequent to activation of said drive means.

27. The apparatus recited in claim 22, wherein:
said joining means includes a thermocompression bonding head for bonding said end portion of the conductive filament to the predetermined terminal area of the element.

28. The apparatus recited in claim 22, including:
positioning means for effecting registration between a predetermined portion of the joined continuous conductive filament and a second predetermined terminal area;
joining means for joining the predetermined portion to the second predetermined terminal area.

29. The apparatus recited in claim 28, including:
notching means for notching the continuous conductive filament adjacent to the predetermined filament portion to provide a predictable break point for the continuous conductive filament; and
force inducing means for exerting a force on the continuous conductive filament during deactivation of said drive means to break the continuous conductive filament at the break point.

30. The apparatus recited in claim 28, including:
shuttle means for effecting relative movement between said translatable guide means and the work station prior to activation of said positioning means.

31. The apparatus recited in claim 22, wherein:
the continuous conductive filament is fine wire having a thickness of between about 0.7 to about 4 mils.

* * * * *

UNITED STATES PATENT AND TRADEMARK OFFICE
CERTIFICATE OF CORRECTION

PATENT NO. : 4,140,265
DATED : February 20, 1979
INVENTOR(S) : Ronald Morino

It is certified that error appears in the above-identified patent and that said Letters Patent are hereby corrected as shown below:

Column 1, line 67; cancel "along", first occurrence.

Column 5, line 5; cancel "chis" and substitute --chips--

Column 7, line 34; cancel "their", first occurrence.

Claim 22, line 2; after "conductive" and before "filament"

insert the following:

--filaments to an element mountable at a work station, the improvement which comprises:

individual translatable guide means for individually guiding each of a plurality of continuous conductive filaments along a fixed path toward the work station;

frame means for supporting and guiding each of

UNITED STATES PATENT AND TRADEMARK OFFICE
CERTIFICATE OF CORRECTION

PATENT NO. : 4,140,265
DATED : February 20, 1979
INVENTOR(S) : Ronald Morino

It is certified that error appears in the above-identified patent and that said Letters Patent are hereby corrected as shown below:

said guide means along a linear path toward the work station;

clamping means coupled to said translatable guide means at a point remote from the work station for fixedly clamping the continuous conductive filament extending along the fixed path;

drive means for driving said translatable guide means a predetermined fixed distance toward the work station to pull the end portion of the clamped continuous conductive--

Signed and Sealed this

Twenty-third Day of October 1979

[SEAL]

Attest:

RUTH C. MASON
Attesting Officer

LUTRELLE F. PARKER
Acting Commissioner of Patents and Trademarks